(12) United States Patent
Fujii et al.

(10) Patent No.: US 6,236,279 B1
(45) Date of Patent: May 22, 2001

(54) OSCILLATOR AND COMMUNICATIONS DEVICE

(75) Inventors: Yasutaka Fujii, Nagaokakyo; Sadao Yamashita, Kyoto; Taiyo Nishiyama, Otsu, all of (JP)

(73) Assignee: Murata Manufacturing Co., Ltd. (JP)

(*) Notice: Subject to any disclaimer, the term of this patent is extended or adjusted under 35 U.S.C. 154(b) by 0 days.

(21) Appl. No.: 09/315,389

(22) Filed: May 20, 1999

(30) Foreign Application Priority Data

May 22, 1998 (JP) .................................................. 10-141421

(51) Int. Cl.[7] .................................. H03B 5/18; H05K 5/00
(52) U.S. Cl. ................................. 331/68; 331/96; 361/752
(58) Field of Search ................................. 331/68, 96, 99, 331/67; 361/752, 756, 759

(56) References Cited

U.S. PATENT DOCUMENTS

| | | | |
|---|---|---|---|
| 4,586,006 | 4/1986 | Emmons | 331/69 |
| 4,627,533 | 12/1986 | Pollard | 206/328 |
| 4,628,283 | 12/1986 | Reynolds | 331/68 |
| 5,661,441 | * 8/1997 | Morino et al. | 331/68 |

FOREIGN PATENT DOCUMENTS

| | | |
|---|---|---|
| 505963A2 | 9/1992 | (EP) . |
| 678974A2 | 10/1995 | (EP) . |

\* cited by examiner

Primary Examiner—Siegfried H. Grimm
(74) Attorney, Agent, or Firm—Ostrolenk, Faber, Gerb & Soffen, LLP

(57) ABSTRACT

An oscillator wherein deviation in the position of a cap of a package is monitored when removing and replacing the cap to adjust the characteristics of the oscillator, and which has stable characteristics. The oscillator comprises a package, a resonator stored in the package, a circuit board and a member for securing the package, the member for securing being attached to the circuit board and contacting two opposing inside faces of the package.

30 Claims, 6 Drawing Sheets

OSCILLATOR AND COMMUNICATIONS DEVICE

BACKGROUND OF THE INVENTION

1. Field of the Invention

The present invention relates to an oscillator and a communications device in which a circuit board and a resonator and the like are stored in a package.

2. Description of the Related Art

By way of background, an example of an oscillator will be discussed as shown in FIGS. 6 and 7, it being understood that this oscillator was not known at the time of the present invention and, therefore, is not prior art to the instant application. FIG. 6 is an exploded perspective view of the oscillator, and FIG. 7 is a cross-sectional view taken along the line Z—Z of FIG. 6.

As shown in FIGS. 6 and 7, oscillator 110 comprises a package 111, a case 130, a resonator 120 and a circuit board 140. The package 111 comprises a steel cap 112 and a stem 113. Terminal pins 114 are provided at three corners of the stem 113. The case 130 has a two-level concave portion 131 in its center, and is provided on top of the stem 113. The resonator 120 comprises an electrode 122, which is provided on two opposing faces of a dielectric substrate 121, and a substantially circular electrode removal portion 123 is provided roughly in the center of the electrode 122. Furthermore, the electrode 122 is also provided on the four side faces of the dielectric substrate 121. The resonator 120 is held in the concave portion 131 of the case 130, and the two-level structure of the concave portion 131 creates a space near an electrode removal portion 123 in the bottom face of the resonator 120.

The circuit board 140 comprises a circuit pattern, such as a stripline, provided on an insulated substrate 141. A FET 142, a varactor diode 152, a chip capacitor 143 and chip resistors 144a, 144b and 144c and the like are provided at predetermined positions on the substrate 141. The circuit board 140 is mounted on the case 130, and terminal electrodes 149, 150 and 153 of the circuit board 140 are connected to the terminal pins 114.

The case 130, with the resonator 120 therein, is placed on the stem 113 and the circuit board 140 is mounted on the case 130. Thereafter, a cap 112 is provided over the assembly. The cap 112 is hermetically sealed to the stem 113, forming the oscillator 110.

The characteristics of an oscillator are greatly affected by the relative positions of the resonator and the circuit board or the cap. That is, when the positions of the resonator and the cap change, the distribution of the electromagnetic field changes, greatly affecting the characteristics of the oscillator. This effect is particularly noticeable at high-frequency bands such as microwave and milliwave bands, which require positioning with precision of below 0.1 mm.

Therefore, in order to obtain the desired characteristics, it is necessary to repeatedly measure the characteristics of the oscillator while adjusting the relative position. Each time, the cap and the circuit board are removed and the position of the resonator is altered. Then, the circuit board is remounted and the cap is replaced.

However, some deviation in position of the cap inevitably occurs each time the cap is replaced. Consequently, when the cap is removed and the position of the resonator and the like is altered, the deviation in the position of the cap thereafter changes the distribution of the electromagnetic field, making it difficult to measure characteristics of the oscillator appropriately and with stability. Furthermore, due to the deviation in the position of the cap, the path of a ground electrode from the cap to the stem is also unstable, affecting the characteristics of the oscillator.

SUMMARY OF THE INVENTION

The oscillator of the present invention has been realized in consideration of the problems described above.

The oscillator of the present invention comprises a package, a resonator held in the package; a circuit board; and a member for securing the package, the member for securing contacting two opposing inside faces of the package.

Consequently, the cap of the package is secured, and the electromagnetic field distribution of the oscillator is stable.

Preferably, the member for securing comprises a metal plate, connected in one direction to a ground electrode of the circuit board.

Consequently, the path of ground current is stabilized.

Preferably, the member for securing, which contacts two opposing inside faces of the package, has an elastic member for securing which contacts one inside face, and a rigid member for securing which contacts the other inside face.

Consequently, the force applied to the cap by the member for securing is not excessive.

Preferably, the member for securing contacts inside faces of the package in two directions, which are roughly at a right angle to each other.

Consequently, the cap is secured with more stability.

Preferably, the member for securing comprises a single plate-like member.

Consequently, the member for securing needs only a small number of components, making it easier to form.

The member for securing, which contacts one of the inside faces of the package, preferably has a sawtooth shape.

Consequently, the member for securing contacts the inside face of the package at many points.

A communications device of the present invention comprises a circuit for transmitting, a circuit for receiving and an antenna, the circuit for transmitting and/or the circuit for receiving comprising the above oscillator.

As a result, a communications device with stable characteristics can be obtained.

DESCRIPTION OF THE PREFERRED EMBODIMENTS

An oscillator according to an embodiment of the present invention is discussed with reference to FIGS. 1 and 2.

Figure 1:
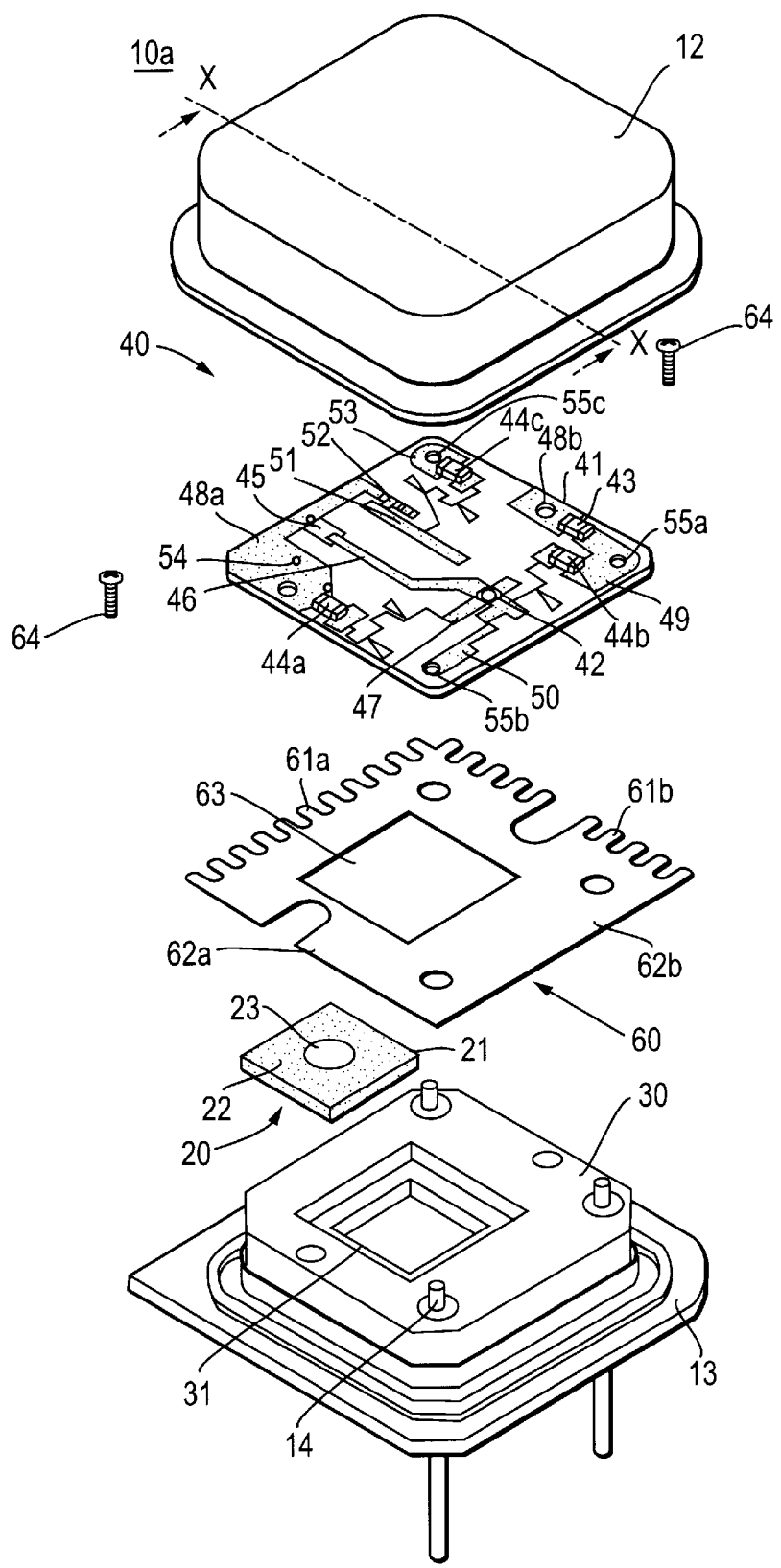
FIG. 1 is an exploded perspective view of an oscillator of the present invention.
Figure 2:
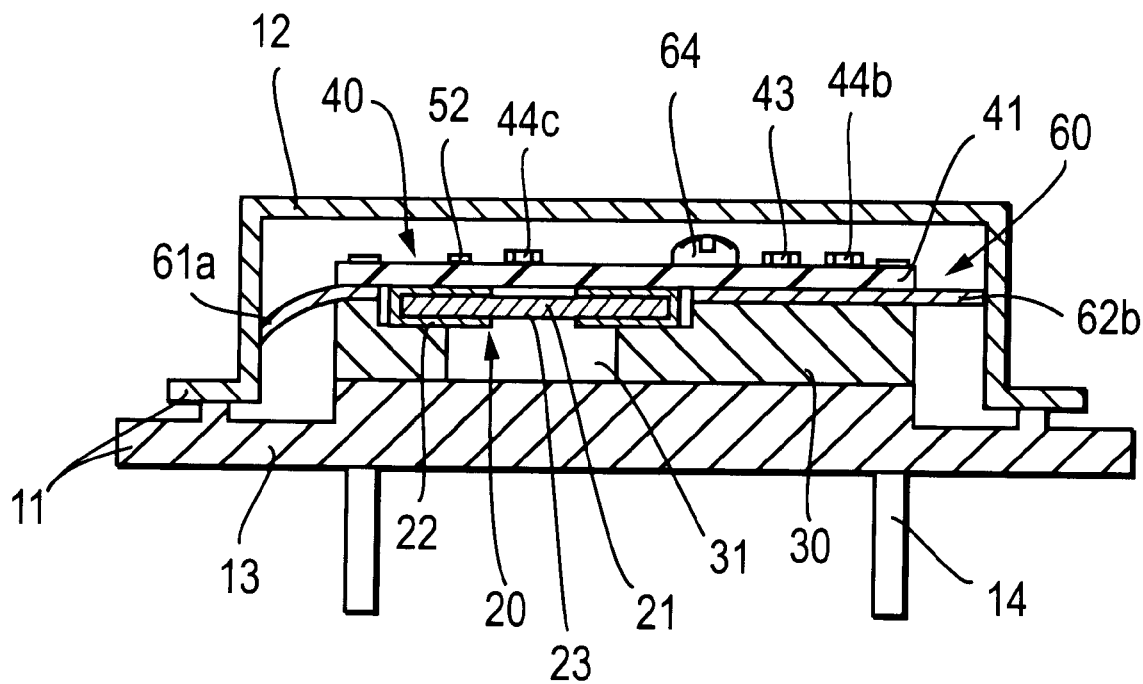
FIG. 2 is a cross-sectional view taken along the line X—X of FIG. 1.

As shown in FIGS. 1 and 2, the oscillator 10a of the present invention comprises a package 11, a case 30, a resonator 20, a circuit board 40 and a member for securing 60. The package 11 comprises a cap 12 and a stem 13. The cap 12, the case 30 and the stem 13 should preferably have roughly the same coefficient of linear expansion as the resonator 20. For instance, they may comprise steel. The cap 12 and the stem 13 are hermetically sealed together. Furthermore, terminal pins 14 are provided at three corners of the stem 13.

The resonator 20 comprises an electrode 22, provided on two opposite faces of a dielectric substrate 21, and a substantially circular electrode removal portion 23 is provided roughly in the center of the electrode 22. Furthermore, the electrode 22 is also provided on the four side faces of the dielectric substrate 21, and functions as a ground. The resonator 20 of such a constitution functions as a resonator when an electromagnetic field becomes concentrated near the substantially circular electrode removal portion 23.

A concave portion 31, into which the dielectric resonator 20 is disposed, is provided roughly in the center of the case 30. A step projects from the inner wall of the concave portion 31. This step should be wide enough to support the bottom face of the resonator 20. Consequently, a space is formed below the electrode removal portion 23, provided in the bottom face of the resonator 20 and the stem 13 (FIG. 2).

The circuit board 40 comprises a stripline pattern on an insulated substrate 41, a FET 42, a chip capacitor 43, chip resistors 44a, 44b and 44c, a film-like terminal resistor 45 and a varactor diode 52. One end of a main line 46, comprising a stripline, is connected to the gate of the FET 42, and the other end is connected to a film-like terminal resistor 45. Furthermore, the stripline 47, which connects to the source of the FET 42, is connected via the chip resistor 44a to a ground electrode 48a. One of the striplines connecting to the drain of the FET 42 is connected via the chip resistor 44b to an input terminal electrode 49. The input terminal electrode 49 connects via the chip capacitor 43 to a ground electrode 48b. The drain of the FET 42 is connected via a capacitor component, comprising a gap provided in the stripline, to an output terminal electrode 50.

An auxiliary line 51, comprising a stripline, is connected at a predetermined position via the varactor diode 52 to the ground electrode 48a. Furthermore, a stripline is extracted at another position on the auxiliary line 51, and connects via the chip resistor 44c to a bias terminal electrode 53. When a voltage is applied to the varactor diode 52, the capacitance of the varactor diode 52 changes, whereby the oscillating frequency of the oscillator 10 can be changed.

The member for securing 60 is formed by working a metal such as phosphoric bronze. Two adjacent sides 61a and 61b of the flat plate-like member for securing 60 have a sawtooth-shape, and the other two sides 62a and 62b are straight. The sawtooth shape of the two sides 61a and 61b provides elasticity, and the straight shape of the other two sides 62a and 62b provides rigidity. Furthermore, when forming the oscillator 10a, a hole 63 is preferably provided roughly in the center of the member for securing 60, which is clasped between the resonator 20 and the circuit board 40, in order to achieve electromagnetic coupling between the resonator 20 and the striplines of the circuit board 40. The member for securing 60 has a slightly larger area than the opening of the cap 12 as viewed from above such that when the cap 12 is mounted on the stem 13, part of the member for securing 60 contacts the inner walls of the cap 12, and the resilient characteristic of the member for securing 60 firmly secures it to the cap 12.

The case 30 is provided on the stem 13 and the resonator 20 is housed in the concave portion 31 of the case 30. The member for securing 60 is mounted to the case 30, and the circuit board 40 is mounted above the member for securing 60. After the circuit board 40 has been mounted, the circuit board 40 and the member for securing 60 and the case 30 are fixed in place by a screw 64 (or other suitable element). As a result, the ground electrode on the bottom surface of the circuit board 40, connected via a through hole to the ground electrodes 48a and 48b on the top surface of the circuit board 40, is connected to the member for securing 60. The member for securing 60 may be connected to the circuit board 40 and the case 30 using a conductive adhesive or the like.

The terminal pins 14, provided at three corners of the stem 13 and the case 30, are inserted through holes 55a, 55b and 55c, provided respectively in the input terminal electrode 49, the output terminal electrode 50 and the bias terminal electrode 53 of the circuit board 40, and connect respectively to the terminal electrodes 49, 50 and 53. The holes 55a, 55b and 55c, provided in the circuit board 40, are the same shape as the terminal pins 13 so as to be always connected thereto.

Thereafter, when the cap 12 is placed over the top as shown in the cross-sectional view of FIG. 2, as a result of the elasticity of the sawtooth-shaped ends 61a and 61b of the member for securing 60 and the rigidity of the straight ends 62a and 62b, the sawtooth-shaped end 61a bends downward and contacts the inside wall of the cap 12. The cap 12 receives the force of the member for securing 60 on its inside face, thereby securing the position of the cap 12. Therefore, when the cap 12 is removed, in order to adjust the positions of the resonator 20 and the circuit board 40, and then replaced, the position of the cap 12 remains fixed. Furthermore, since a metal member for securing 60 is used, the ground electrodes of the circuit board 40 are connected to the cap 12 by the member for securing 60. As a consequence, the ground current flowing through the cap 12 passes through the member for securing 60, and the stable positional relationship between the cap 12 and the member for securing 60 ensures a stable ground current path. As is clear from the above explanation, the area of the open portion of the cap 12 and the area of the member for securing 60 are determined so as to achieve the above action. The exact area depends on the rigidity of the member for securing 60, and the rigidity of the cap 12, and the like. The area should be determined so that the device can be secured in the manner described above.

In the present embodiment, the member for securing 60 is made elastic by having ends 61a and 61b which have a sawtooth shape, but alternatively, the ends of the member for securing 60 may be made elastic by, for instance, reducing their thickness. Furthermore, in the present embodiment, opposing inside faces of the cap 12 in two directions are secured by the member for securing 60 having elastic ends 61a and 61b and rigid ends 62a and 62b, but the cap 12 can be secured when both ends of the member for securing 60 are rigid. Moreover, in the present embodiment, the member for securing 60 comprises phosphoric bronze, but it may for instance comprise conductive rubber or the like.

The present embodiment described a voltage-controlled oscillator using a varactor diode 52, but the present invention is not limited to this. For instance, the present invention can be applied to an oscillator which does not use an auxiliary line portion, or to an oscillator which uses a gunn diode instead of the FET 42, or such like.

Figure 3:
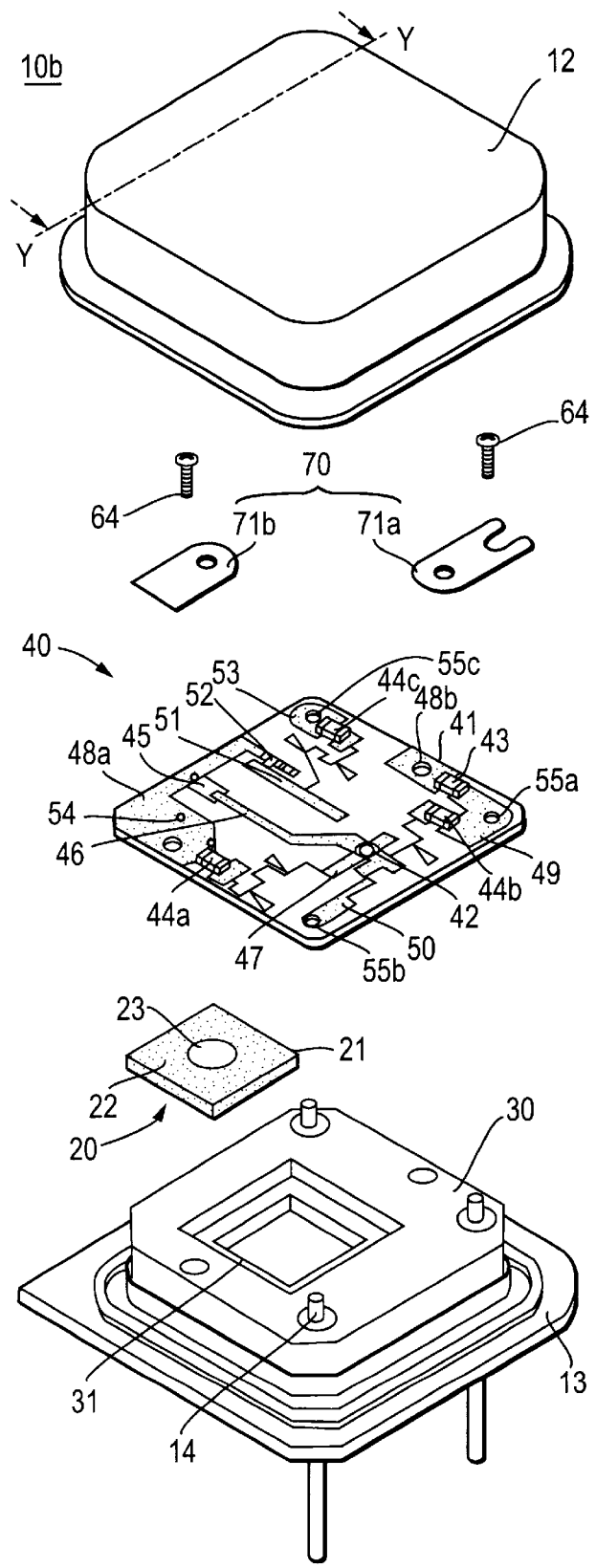
FIG. 3 is an exploded perspective view of a second oscillator of the present invention.
Figure 4:
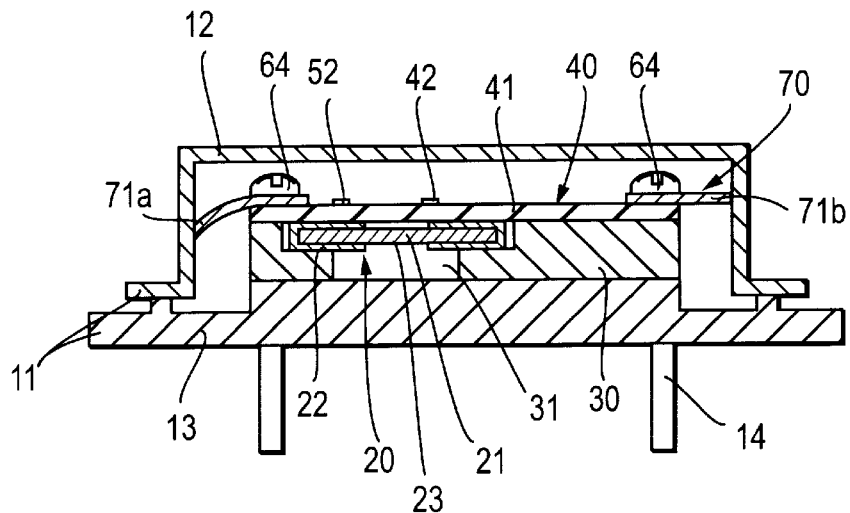
FIG. 4 is a cross-sectional view taken along the line Y—Y of FIG. 3.

A second embodiment of the present invention will now be described with reference to FIGS. 3 and 4. Portions which are the same as in the previous embodiment are represented by the same reference numerals.

In this embodiment, a member for securing 70 comprises two metal pieces 71a and 71b. The end of one metal piece 71a has a sawtooth shape, and the end of the other metal piece 71b is straight. The two metal pieces 71a and 71b are affixed to the ground electrodes 48a and 48b on the top face of the circuit board 40 by screws 64. Thereafter, as in the first embodiment, when the cap 12 is placed on top, the metal piece 71a, which has a sawtooth-shaped end, bends downward and contacts the inside face of the cap 12, as shown in FIG. 4. The metal piece 71b which has a straight end does not bend, and contacts with an inside face of the cap 12 which is opposite to the above inside face.

The cap 12 receives the force of the member for securing 70 on its inside face, thereby fixing the cap 12 in position. Therefore, when the cap 12 is removed, in order to adjust the positions of the resonator 20 and the circuit board 40, and then replaced, the position of the cap 12 remains fixed. Furthermore, since a metal member for securing 70 is used, the ground electrodes of the circuit board 40 are connected to the cap 12 by the member for securing 70. As a consequence, the ground current flowing through the cap 12 passes through the member for securing 70, and the stable positional relationship between the cap 12 and the member for securing 70 ensures a stable path of ground current.

Figure 5:
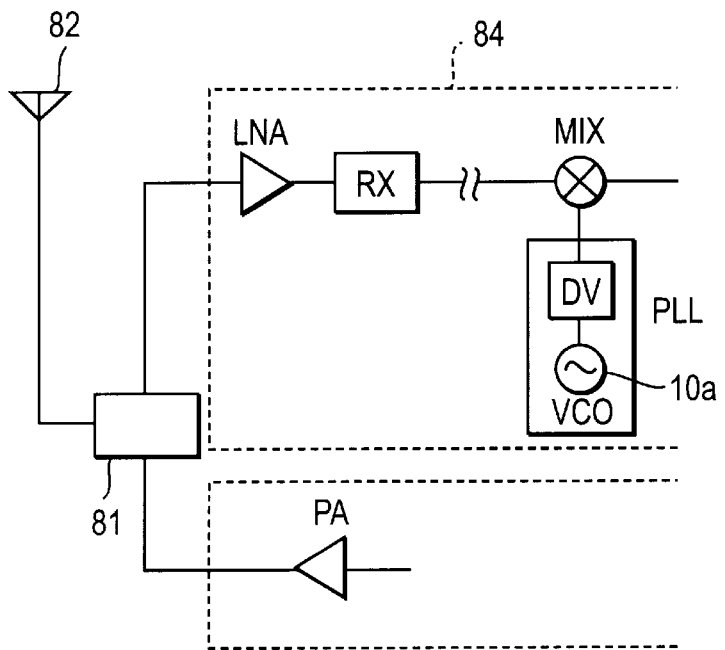
FIG. 5 is a schematic view of a communications device of the present invention.
Figure 6:
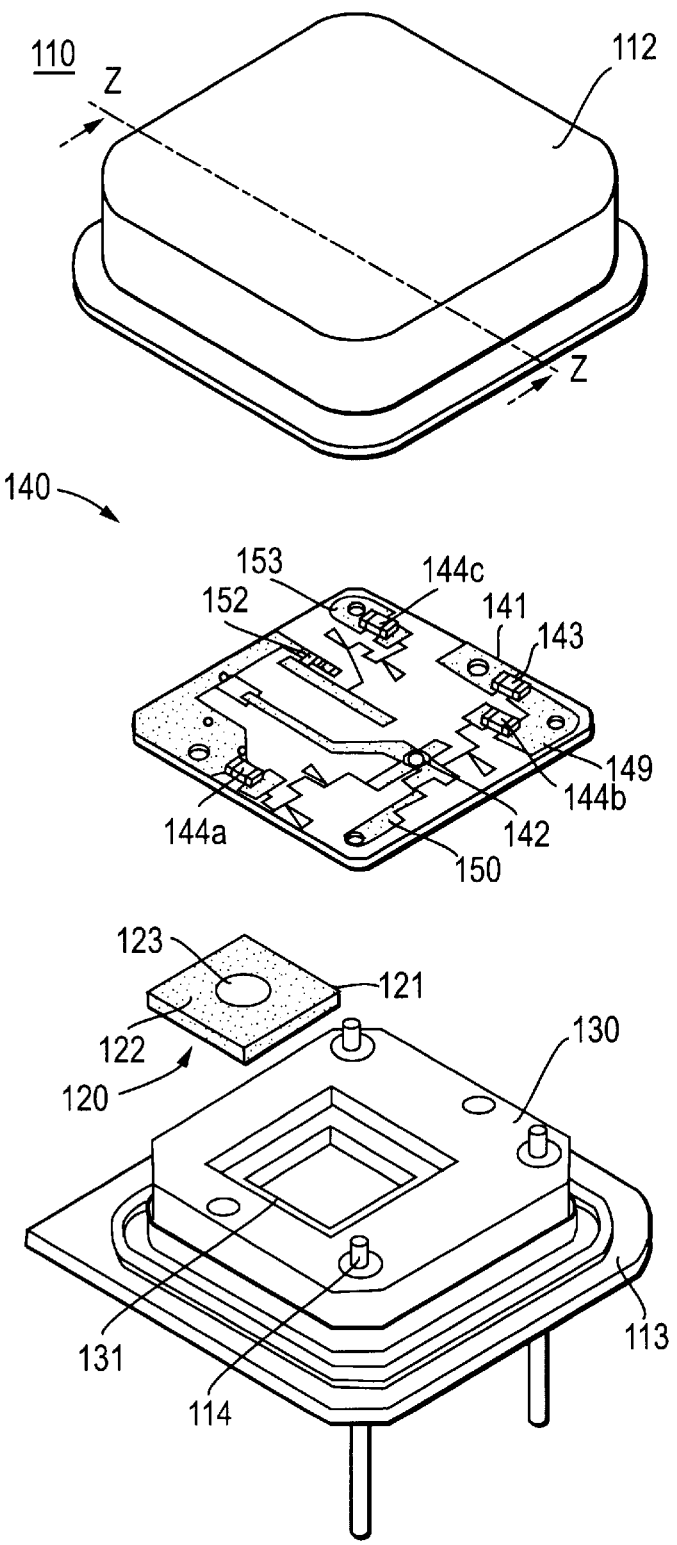
FIG. 6 is an exploded perspective view of a general oscillator.
Figure 7:
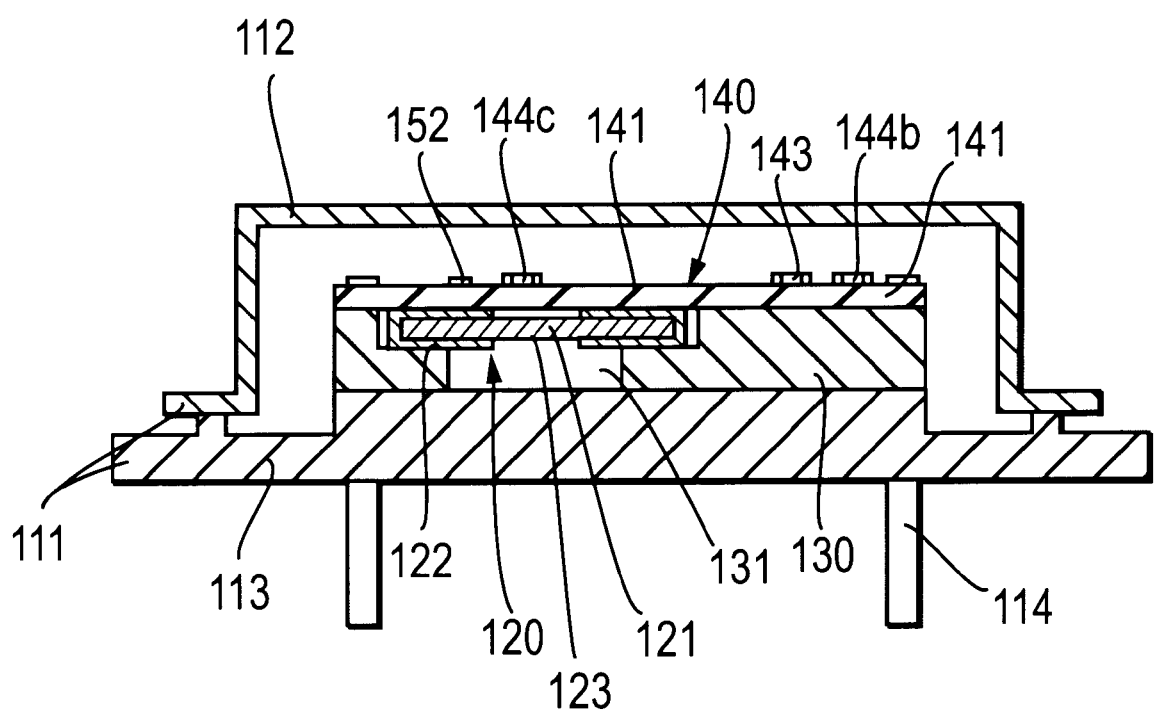
FIG. 7 is a cross-sectional view taken along the line Z—Z of FIG. 6.

A communications device of the present invention will now be described with reference to FIG. 5.

The communications device 80 of the present invention comprises a duplexer 81, comprising a filter for transmitting and a filter for receiving, an antenna 82, which connects to a terminal for antenna connection of the duplexer 81, a circuit for transmitting 83, connected to input/output terminals of the filter for transmitting of the duplexer 81, and a circuit for receiving 84, connected to input/output terminals of the filter for receiving of the duplexer 81.

The circuit for transmitting 83 has a power amplifier (PA) for power-amplifying the transmission signal, which passes through the filter for transmitting and is emitted from the antenna 82. Furthermore, a reception signal is passed from the antenna 82 through the filter for receiving, and is received by the circuit for receiving 84. After passing a low-noise amplifier (LNA) and a filter (RX) in the circuit for receiving 84, the signal is input to a mixer (MIX). The base oscillator is a phase-locked loop (PLL), comprising an oscillator (VCO) 10a and a divider (DV), and outputs a local signal to the mixer. The mixer outputs at intermediate frequency.

As a result, it is possible to provide a communications device which is less time-consuming and inexpensive to manufacture. This embodiment described an example using the oscillator as the circuit for receiving, but the communications device of the present invention is not limited to this, and can be applied when the oscillator is used as the circuit for transmitting, or when an oscillator is used as both.

The present invention described above employs a member for securing which contacted the inside face of the cap of a package. As a result, the position of the cap is secured, so that when the cap is removed and then replaced after adjusting the positions of the resonator and the circuit board, its position is always fixed. Therefore, the characteristics of the oscillator can always be measured under the same conditions, making it possible to obtain an oscillator having stable characteristics.

Furthermore, a metal member for securing is used, one end thereof being connected to a ground electrode of the circuit board. Consequently, the path of ground current flowing through the cap is stable, making it possible to provide an oscillator having good characteristics.

Furthermore, the member for securing comprises an elastic member for securing, which contacts one of two opposite inside faces of the cap, and a rigid member for securing, which contacts the other of the inside faces. Consequently, the elasticity of one inside face allows the cap to receive excess force using the member for securing, reducing the danger that the cap will be warped.

Furthermore, the member for securing contacts opposing inside faces of the cap in two directions which are roughly at a right angle to each other. Consequently, the cap can be secured with even more stability than when the member for securing contacts opposing inside faces of the cap in only one direction, making it possible to provide an oscillator with stable characteristics.

Furthermore, the member for securing comprises a single plate-like member. Consequently, the number of components can be reduced, and the member for securing can be manufactured easily. Furthermore, even when the member for securing is provided between the case and the circuit board, the circuit board does not shake and remains stable.

The elastic portion of the member for securing, which contacts the inside faces of the cap, has a sawtooth shape. Consequently, the member for securing contacts many points on the inside face of the cap, further stabilizing the cap in a secure position. Furthermore, the path of ground current flowing through the cap is stabilized.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An oscillator, comprising:

a package;

a resonator disposed in said package;

a circuit board in electromagnetic communication with said resonator; and a securing member operable to secure said package, said securing member contacting two opposing inside faces of said package;

wherein said securing member, which contacts two opposing inside faces of said package, has an elastic securing portion which contacts one inside face, and a rigid securing portion which contacts said other inside face.

2. An oscillator, comprising:

a package;

a resonator disposed in said package;

a circuit board in electromagnetic communication with said resonator; and a securing member operable to secure said package, said securing member contacting two opposing inside faces of said package;

wherein said securing member, which contacts one of said inside faces of said package, has a sawtooth shape.

3. An oscillator, comprising:

a base;

a dielectric resonator coupled to said base;

a circuit board in electromagnetic communication with said resonator;

a cap having an inside surface and operable to removably enclose at least said dielectric resonator and said circuit board; and a securing member being disposed in a substantially fixed position with respect to said dielectric resonator and said circuit board, said securing member including a first engagement edge and an oppositely disposed second engagement edge, said edges contacting corresponding opposing inside surface portions of said cap such that said cap achieves alignment with said dielectric resonator and said circuit board.

4. The oscillator according to claim 3, wherein said first and second engagement edges are substantially rigid and rigidly engage said inside surface portions of said cap.

5. The oscillator according to claim 3, wherein said first engagement edge is substantially rigid and rigidly engages said first inside surface portion of said cap; and said second engagement edge is resilient and resiliently engages said second inside surface portion of said cap.

6. The oscillator according to claim 5 wherein said first engagement edge is a substantially straight edge and said second engagement edge has a plurality of substantially sawtooth shaped teeth.

7. The oscillator according to claim 6 wherein said base, resonator, securing member, and circuit board are stacked in an axial direction; and said substantially sawtooth shaped teeth are operable to flex in said axial direction to resiliently engage said inside surface portion of said cap.

8. The oscillator according to claim 5 wherein said first engagement edge is a substantially straight edge and said second engagement edge has a reduced thickness.

9. The oscillator according to claim 8 wherein said base, resonator, securing member, and circuit board are stacked in an axial direction; and said second engagement edge is operable to flex in said axial direction to resiliently engage said inside surface portion of said cap.

10. The oscillator according to claim 3, wherein said securing member includes:

a third engagement edge disposed adjacent said first and second engagement edges and operable to engage a third inside surface portion of said cap; and a fourth engagement edge disposed opposite to said third engagement edge and adjacent said first and second engagement edges and operable to engage a fourth inside surface portion of said cap.

11. The oscillator according to claim 10, wherein said first, second, third and fourth engagement edges are substantially rigid and rigidly engage said inside surface portions of said cap.

12. The oscillator according to claim 10, wherein:

said first engagement edge is substantially rigid and rigidly engages said first inside surface portion of said cap;

said second engagement edge is resilient and resiliently engages said second inside surface portion of said cap;

said third engagement edge is substantially rigid and rigidly engages said third inside surface portion of said cap; and said fourth engagement edge is substantially resilient and resiliently engages said fourth inside surface portion of said cap.

13. The oscillator according to claim 12, wherein said first and third engagement edges are substantially straight and said second and fourth engagement edges each have a plurality of substantially sawtooth shaped teeth.

14. The oscillator according to claim 13, wherein said base, resonator, securing member, and circuit board are stacked in an axial direction; and said substantially sawtooth shaped teeth are operable to flex in said axial direction to resiliently engage said inside surface portion of said cap.

15. The oscillator according to claim 12, wherein said first and third engagement edges are substantially straight and said second and fourth engagement edges each have a reduced thickness.

16. The oscillator according to claim 15, wherein said base, resonator, securing member, and circuit board are stacked in an axial direction; and said second and fourth engagement edges are operable to flex in said axial direction to resiliently engage said inside surface portion of said cap.

17. The oscillator according to claim 3, wherein said securing member comprises a metal plate connected to a ground electrode of said circuit board.

18. The oscillator according to claim 17, wherein said metal plate includes a first surface disposed toward said dielectric resonator, a second surface, opposite to said first surface, and an aperture in communication with said dielectric resonator;

said circuit board being disposed on said second surface of said metal plate such that said aperture permits electromagnetic communication between said dielectric resonator and said circuit board.

19. The oscillator according to claim 3, wherein said securing member is formed from phosphoric bronze.

20. The oscillator according to claim 3, wherein said securing member is formed from conductive resilient material.

21. The oscillator according to claim 20, wherein said securing member is formed from conductive rubber.

22. The oscillator according to claim 3, wherein said securing member is formed from a first member including said first engagement edge and a separate second member, oppositely disposed from said first member, including said second engagement edge.

23. The oscillator according to claim 22, wherein said first and second engagement edges are substantially rigid and rigidly engage said inside surface portions of said cap.

24. The oscillator according to claim 23, wherein said first engagement edge is substantially rigid and rigidly engages said first inside surface portion of said cap; and said second engagement edge is resilient and resiliently engages said second inside surface portion of said cap.

25. The oscillator according to claim 24 wherein said first engagement edge is a substantially straight edge and said second engagement edge has a plurality of substantially sawtooth shaped teeth.

26. The oscillator according to claim 25 wherein said base, resonator, securing member, and circuit board are stacked in an axial direction; and said substantially sawtooth shaped teeth are operable to flex in said axial direction to resiliently engage said inside surface portion of said cap.

27. The oscillator according to claim 24 wherein said first engagement edge is a substantially straight edge and said second engagement edge has a reduced thickness.

28. The oscillator according to claim 27 wherein said base, resonator, securing member, and circuit board are stacked in an axial direction; and said second engagement edge is operable to flex in said axial direction to resiliently engage said inside surface portion of said cap.

29. An oscillator, comprising:

a package;

a resonator disposed in said package;

a circuit board in electromagnetic communication with said resonator; and a securing member operable to secure said package, said securing member contacting two opposing inside faces of said package;

wherein said package comprises an enclosure which completely encloses said resonator and circuit board, and said securing member contacts two opposing inside faces of said enclosure.

30. A communication device, comprising:

a transmitter;

a receiver; and an antenna, wherein at least one of said transmitter and said receiver comprises an oscillator, said oscillator including:

a package;

a resonator disposed in said package;

a circuit board in electromagnetic communication with said resonator; and a securing member operable to secure said package, said securing member contacting two opposing inside faces of said package;

wherein said package comprises an enclosure which completely encloses said resonator and circuit board, and said securing member contacts two opposing inside faces of said enclosure.

* * * * *